(12) United States Patent
Keith

(10) Patent No.: US 11,459,072 B2
(45) Date of Patent: Oct. 4, 2022

(54) SYSTEM AND METHOD FOR INTEGRATED WATERCRAFT SOLAR PANELS

(71) Applicant: Darrell S. Keith, Eatonton, GA (US)

(72) Inventor: Darrell S. Keith, Eatonton, GA (US)

(*) Notice: Subject to any disclaimer, the term of this patent is extended or adjusted under 35 U.S.C. 154(b) by 113 days.

(21) Appl. No.: 16/994,287

(22) Filed: Aug. 14, 2020

(65) Prior Publication Data

US 2021/0237835 A1 Aug. 5, 2021

Related U.S. Application Data

(60) Provisional application No. 62/887,986, filed on Aug. 16, 2019.

(51) Int. Cl.

| | |
|---|---|
| *B63B 79/40* | (2020.01) |
| *B63B 1/04* | (2006.01) |
| *B63H 25/38* | (2006.01) |
| *B60L 8/00* | (2006.01) |
| *H02S 10/40* | (2014.01) |
| *B63H 16/08* | (2006.01) |

(52) U.S. Cl.
CPC .............. *B63B 79/40* (2020.01); *B60L 8/003* (2013.01); *B63B 1/04* (2013.01); *B63H 16/08* (2013.01); *B63H 25/38* (2013.01); *H02S 10/40* (2014.12); *B63B 2209/14* (2013.01); *B63B 2209/18* (2013.01)

(58) Field of Classification Search
CPC .. B63B 79/40; B63B 1/00; B63B 1/04; B63B 1/16; B63B 2209/14; B63B 2209/18; H02S 10/40; B60L 8/003; B63H 16/08; B63H 25/00; B63H 25/38
USPC ......................................................... 440/3, 6
See application file for complete search history.

(56) References Cited

U.S. PATENT DOCUMENTS

| | | | | |
|---|---|---|---|---|
| 6,000,353 | A * | 12/1999 | De Leu .................... | B63B 1/121 440/6 |
| 6,855,016 | B1 * | 2/2005 | Jansen ..................... | B60L 8/003 440/6 |
| 7,557,291 | B2 * | 7/2009 | Flaherty .................. | H02S 20/23 136/244 |
| 8,047,153 | B2 * | 11/2011 | Wood ....................... | B63B 34/20 440/6 |
| 10,800,265 | B2 * | 10/2020 | Berardi ................... | B60L 8/003 |

FOREIGN PATENT DOCUMENTS

JP H06321178 A * 11/1994 ............... B63B 1/10

* cited by examiner

*Primary Examiner* — Lars A Olson
(74) *Attorney, Agent, or Firm* — Polsinelli PC

(57) ABSTRACT

A system for providing solar power to a watercraft includes a hull having an outer surface, defining a recess extending inward and offset from the outer surface by a distance, and configured to float on water. The system further includes a solar panel configured to fit within the recess and having a thickness that is substantially equal to the distance such that an outer edge of the solar panel is substantially aligned with the outer surface of the hull.

18 Claims, 7 Drawing Sheets

SYSTEM AND METHOD FOR INTEGRATED WATERCRAFT SOLAR PANELS

CROSS-REFERENCE TO RELATED APPLICATIONS

This application claims the benefit and priority of U.S. Provisional Patent Application No. 62/887,986, titled "SYSTEM AND METHOD FOR INTEGRATED WATERCRAFT SOLAR PANELS" and filed on Aug. 16, 2019, the entire contents of which being hereby incorporated by reference herein.

BACKGROUND

1. Field

The present disclosure relates to systems and methods for integrating solar panels and other alternative power generation systems in or on watercraft, and for increasing efficiency of sunlight absorption by such solar panels.

2. Description of the Related Art

Power storage and generation is a concern for many users of watercraft. Such users may wish to ensure that the watercraft retains sufficient power to return to land from an offshore, inshore, or near shore trip. Additionally, some watercraft (e.g., kayaks, paddleboards, canoes, etc.) may be propelled by human effort (such as by paddling, rowing, sailing, or the like), but users of such watercraft may wish to power certain electronics including fish finders, lighting, navigation devices, lights, trolling motors, or live wells for storing live bait. Although watercraft may include batteries for providing this power, batteries are limited in size by the dimensions and the buoyancy of the watercraft. This is especially a concern for lighter watercraft such as paddleboards, kayaks, and canoes as they may have less buoyancy than motorized watercraft, and they also have relatively little free space for battery storage. Additionally, these watercraft may be more prone to overturning than motorized watercraft, and the batteries may short circuit in response to being exposed to water. Furthermore, watercraft batteries require occasional removal for recharging and/or replacement, and the power of these batteries may fully drain while the watercraft is still on the water. Drained batteries could endanger the operator and watercraft along with other watercraft and their respective operators during low light or nighttime operation or in other certain situations.

Thus, there is a need in the art for systems and methods for providing alternative power on watercraft.

SUMMARY

Described herein is a system for providing solar power to a watercraft. The system includes a hull having an outer surface, defining a recess extending inward and offset from the outer surface by a distance, and configured to float on water. The system further includes a solar panel configured to fit within the recess and having a thickness that is substantially equal to the distance such that an outer edge of the solar panel is substantially aligned with the outer surface of the hull.

Also described is a system for providing solar power to a watercraft. The system includes a hull having an outer surface, defining a recess extending inward and offset from the outer surface by a distance, and configured to float on water. The system further includes a solar panel sealed within the recess and having a thickness that is substantially equal to the distance such that an outer edge of the solar panel is substantially aligned with the outer surface of the hull in response to being sealed within the recess.

Also described is a system for providing solar power to a watercraft. The system includes a hull having an outer surface and configured to float on water. The system further includes a solar panel coupled to the hull and configured to generate power in response to receiving sunlight. The system further includes pedals coupled to the hull and configured to be actuated to propel the hull through the water. The system further includes a generator coupled to the pedals and configured to generate power in response to actuation of the pedals.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

The present disclosure describes systems and methods for providing self-sustaining or self-regenerating power for a watercraft. The systems and methods herein include a watercraft having a solar panel formed integrally with a hull, advantageously improving aerodynamics and fluid dynamics of the watercraft. During daylight hours the integrated solar panel, advantageously and continually, provides electrical power to the battery system ensuring sufficient battery capacity to propel the watercraft or to power electronic devices on the watercraft. This, in effect, reduces a total weight of the watercraft due to reduced battery needs. Such weight reduction increases watercraft efficiency as propulsion devices can propel the watercraft using reduced power relative to heavier watercraft. A portion of the hull that includes the integral solar panel may be designed to have a shape that increases exposure of the solar panel to sunlight, advantageously increasing power conversion (and thus generation) of the solar panel. An additional rudder may be installed on the watercraft and may be controllable in order to adjust an orientation of the watercraft relative to the sun (while the watercraft is in water) in order to advantageously further increase exposure of the solar panel to sunlight.

Figure 1A:
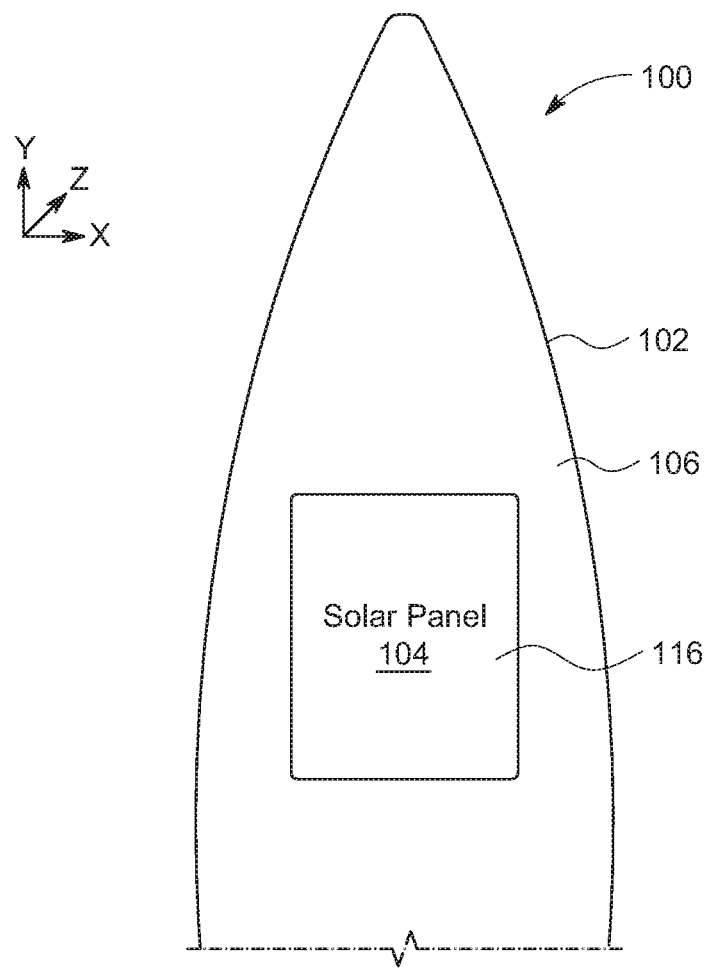
FIG. 1A is a top-down view of a watercraft having a solar panel, in accordance with various embodiments of the present disclosure.
Figure 1B:
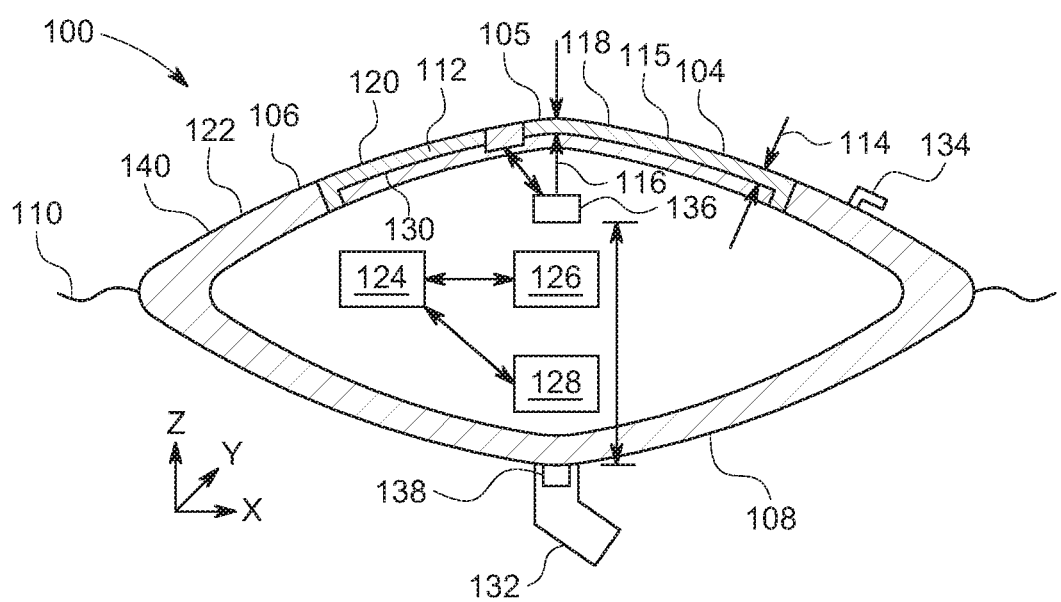
FIG. 1B is a cross-sectional view of the watercraft of FIG. 1A illustrating various features of the watercraft, in accordance with various embodiments of the present disclosure.

Referring to FIGS. 1A and 1B, a watercraft 100 may include a hull 102 and a solar panel 104. The watercraft 100 may be a non-motorized watercraft, such as a sailboat, a kayak, a canoe, a paddleboard, or the like. The watercraft 100 may also be a motorized watercraft having a fuel-burning engine or electric motor. The engine or motor may be a backup engine or motor for providing limp-home functionality, trolling functionality, or the like, or may be a main propulsion source for the watercraft 100.

The hull 102 may have an outer surface 106 and a bottom surface 108. The bottom surface 108 may be designed to be located at least partially within water 110, and the hull 102 may be designed to float in or on the water 110. The outer surface 106 of the hull 102 may define a recess 112 extending inward (i.e., towards the bottom surface 108). A bottom surface (i.e., a surface facing towards the outer surface 106) of the recess 112 may be offset from the outer surface 106 by a distance 114. In some embodiments, the solar panel 104 may have a thickness 115 that is substantially equal to the distance 114. Where used in this context, "substantially equal to" may indicate that the values are within 20 percent (20%) of each other, within 10% of each other, within 5% of each other, or the like.

The recess 112 may have a shape that corresponds to a shape of the solar panel 104 such that the solar panel 104 may be received by the recess 112. In particular, the shape of the solar panel 104 may correspond to the shape of the recess 112 in all three dimensions (i.e., the X, Y, and Z dimensions). When the solar panel 104 is received by the recess 112, an outer surface 116 of the solar panel 104 may be substantially flush with the outer surface 106 of the hull 102. Where used in this context, "substantially flush" may indicate that the surfaces are separated by 2 inches, by 1 inch, by ½ of an inch, by ¼ of an inch, or the like. Placing the outer surface 116 of the solar panel 104 substantially flush with the outer surface 106 of the hull 102 provides advantages such as reducing the likelihood of an individual tripping on the solar panel 104, reducing the likelihood of an object (e.g., clothes) becoming snagged or caught on the solar panel 104, and reduces the likelihood of such a snag or catch pulling the solar panel 104 out of its location on the hull 102.

The recess 112 and the solar panel 104 may be positioned at any location on the outer surface 106 of the hull 102 provided the solar panel 104 faces away from the water 110 (and thus towards sunlight). For example, the recess 112 and the solar panel 104 may be located closer to the forward end of the hull 102, closer to the aft end of the hull 102, centered between the forward end and the aft end, closer to the starboard side of the hull 102, closer to the port side of the hull 102, or centered between the starboard side and the port side.

The solar panel 104 may include any device that converts sunlight into electrical energy and may include one or more solar cell. For example, the solar panel 104 may include photovoltaic solar cells or solar modules connected in any manner (i.e., in series, in parallel, or some combination thereof) that together convert sunlight (or other light) into electrical energy and output the electrical energy. In some embodiments, a junction box 105 may be in electrical communication with the solar panel 104 and may perform modulation, demodulation, power conversion (e.g., alternating current (AC) to direct current (DC) conversion, DC to AC conversion, changing a frequency, changing a voltage, etc.), or any other function to the electrical energy that is output by the solar panel 104 (such as to groom the electrical energy for use by one or more component on the watercraft 100). The junction box 105 may be located at any location on the watercraft 100. In some embodiments, it may be desirable for the junction box 105 to be centered along a horizontal axis (X axis) of the hull 102 in order to keep the hull 102 balanced in the water 110.

The solar panel 104 may be formed from, or may include, a flexible material. In that regard, the solar panel 104 may be installed on the hull 102 during manufacture of the watercraft 100 and may be manipulated to lay flush against the hull 102. In some embodiments, the hull 202 may be formed around outer edges of the solar panel 104, or the solar panel may be molded in place by or with the hull 102. The solar panel 104 may be considered to be integrated into the hull 102, body, frame, or the like of the watercraft 100, and may thus be considered to be integral with, or a permanent part of, the watercraft 100 (although the solar panel 104 may be replaceable). The solar panel 104 may likewise be considered to be permanently installed on the hull 102, meaning that the solar panel 104 may remain with the hull 102 throughout the life of the hull 102. Because the solar panel 104 is installed to be flush with the hull 102, the solar panel 104 may have greater resistance to damage than a solar panel 104 which extends outward from a hull (i.e., greater resistance than an aftermarket solar panel that is installed on a watercraft after manufacture of the watercraft). In some embodiments, the hull 102 may include a curvature 118 in any direction and the solar panel 104 may be manipulated to lay flush with the hull 102 at all locations of the hull (even over the curvature 118).

In some embodiments, the solar panel 104 may further include a transparent coating 120 located on the outer surface 116 of the solar panel 104. Some solar panels 104 may be designed to be resistant to damage, and thus the transparent coating 120 may be an optional feature. The transparent coating 120 may be transparent to some or all wavelengths of sunlight (e.g., may be transparent to wavelengths of sunlight that are converted into electrical energy by the solar panel 104), and may also include antireflective properties in order to maximize sunlight absorption by the solar panel 104. In some embodiments, the transparent coating 120 may provide aesthetic, water resistance, scratch or other damage resistance, anticorrosive, or other desirable properties. The hull 102 may also include a coating 122 around some or all of the hull 102. The coating 122 may be a glossy coating and may provide aesthetic, water resistance, scratch or other damage resistance, anticorrosive, or other properties. In some embodiments, the coating 120 of the solar panel 104 may be the same material as the coating 122 of the hull 102 and may enclose the solar panel 104 and some or all of the hull 102 within the coating 120, 122. In some embodiments, the coating 120 of the solar panel 104 (and the coating 122 of the hull 102) may encapsulate the solar panel 104 within the recess 112, thus retaining the solar panel 104 in place relative to the hull 102, and retaining the solar panel 104 to be relatively flush with the hull 102. In that regard, the coatings 120, 122 may be installed over the solar panel 104 and the hull 102 simultaneously.

In some embodiments, the watercraft 100 may further include a battery or other energy storage device 124. The battery 124 may store electrical energy for use by one or more components of the watercraft 100. For example, the watercraft 100 may include one or more electric component 126 (such as a sonar sounder, a radar sounder, a livewell, a radio, or the like) as well as a thrust generator 128 (such as an electric motor with a propeller or a jet for jet propulsion; e.g., a trolling motor or limp-home motor). The electrical energy stored in the battery 124 may be used to power at least one of the electric component 126 or the thrust generator 128. In some embodiments, the watercraft 100 may include only the electrical component 126 or the thrust generator 128.

It may be desirable for the battery 124 to be centered along a longitudinal axis of the hull 102 (i.e., equidistant between the port and starboard sides) to keep the hull 102 balanced in the water. In some embodiments, the junction box 105 and the battery 124 may each be offset from the longitudinal axis in opposite directions to balance the hull 102 in the water.

The solar panel 104 may be electrically coupled to the battery 124 via one or more cable or wire 130 (and/or via the junction box 105). In that regard, electrical energy generated by the solar panel 104 may be transmitted to the battery 124 via the cable or wire 130 for storage in the battery 124. The solar panel 104 may continuously provide power to the battery 124 during daylight hours to keep the battery 124 charged and ready to provide power to any connected load. This may be especially desirable if the watercraft 100 utilizes an electric motor to propel the watercraft 100 through water, as continuous recharging of the battery 124 increases a range of the watercraft 100. In some embodiments, the solar panel 104 may cease providing the electrical power to the battery 124 in response to a state of charge (SOC) of the battery reaching or exceeding a threshold SOC (e.g., an SOC of 90 percent (90%), 95%, 98%, or the like). In such embodiments, the power from the solar panel 104 may bypass the battery and flow directly to one or both of the electric component 126 or the thrust generator 128. For example, the junction box 105 may include a controller (or a controller 136 may be present elsewhere on the watercraft 100 and coupled to one or both of the junction box 105 or the solar panel 104) which may disconnect the battery 124 from the solar panel 104 in response to the SOC of the battery 124 reaching or exceeding the threshold SOC. The controller may likewise cause the solar panel 104 to be electrically coupled to the electric component 126 or the thrust generator 128 in such a situation. For example, a switch (not shown) may be present between the solar panel 104 (or junction box 105) and the battery 124 (and potentially between the solar panel 104 and the electric component 126/thrust generator 128) and may disconnect the battery from the solar panel 104 in response to the SOC of the battery 124 reaching or exceeding the threshold SOC.

The solar panel 104 may continuously provide power to the battery 124 until the SOC of the battery 124 reaches or exceeds the threshold SOC. This means that the battery 124 may continue charging regardless of whether the watercraft 100 is in the water, on a trailer, on land, or in a slip. This reduces a necessity to recharge the battery 124 when the boat is out of the water, and reduces a necessity to use conventional electric battery charge methods (e.g., plugging the battery 124 in to a wall outlet or removing the battery from the watercraft 100). In that regard, the battery 124 may only requirement removal from the hull 102 for replacement.

The controller 136 may include one or more logic devices such as one or more of a central processing unit (CPU), an accelerated processing unit (APU), a digital signal processor (DSP), a field programmable gate array (FPGA), an application specific integrated circuit (ASIC), or the like. In various embodiments, the controller 136 may further include any non-transitory memory known in the art. The memory may store instructions usable by the logic device to perform operations.

The electrical energy may be stored in the battery 124 for later use or may pass through the battery 124 to one or both of the electric component 126 or the thrust generator 128. In some embodiments, the solar panel 104 (and/or the junction box 105) may be directly coupled to at least one of the electric component 126 or the thrust generator 128. However, considerations may be required to account for fluctuations in power generated by the solar panel 104. For example, the junction box 105 may modulate or otherwise alter the electrical power from the solar panel 104 to cause the electrical power to have a predetermined voltage and frequency of AC power or a predetermined voltage of DC power prior to the power reaching the electric component 126 or the thrust generator 128 (or the battery 124).

In some embodiments, the watercraft 100 may further include a rudder 132 designed to be in the water 110 when the watercraft 100 is floating. The rudder 132 may be designed to rotate about the Z axis. For example, a handle 134 may be mechanically coupled to the rudder 132. The handle 134 may be manipulated by a user to change the orientation of the rudder 132 about the Z axis. In some embodiments, the orientation of the rudder 132 may be changed via any other means such as physical manipulation of the rudder 132, electrical control of the rudder 132 (e.g., by the controller 136 which may or may not calculate the ideal orientation of the solar panel 104 relative to the sun), or the like. The position of the rudder 132 in the water may change the orientation and/or the heading of the hull 102 such that manipulation of the handle 134 adjusts the orientation/heading of the hull 102 in the water 110. In that regard, a user of the watercraft 100 may change the orientation of the hull 102 (e.g., by manipulating the handle 134) to orient the solar panel 104 towards the sunlight in order to optimize conversion of sunlight into electrical energy. In some embodiments, a guide (such as a drawing, text, an instruction manual, or the like) may be installed on the watercraft 100 (or available for storage on the watercraft 100) at a location near the handle 134. The guide may provide instructions regarding how to manipulate the handle 134 to change the orientation of the hull 102 to increase exposure of the solar panel 104 to the sunlight.

In some embodiments, a mechanical actuator 138 may be coupled to the rudder 132 and may control the orientation of the rudder 132. For example, a steering wheel (not shown) or other input device may be coupled to the controller 136 (or directly coupled to the actuator 138) and the controller 136 may transmit control signals to the actuator 138 based on inputs received by the input device corresponding to steering instructions. A sensor 140 (e.g., light sensor) may be present on the hull 102 and capable of detecting data usable to position the hull 102 in the water relative to a location of the sun in order to maximize exposure of the solar panel 104 to the sun. For example, the sensor 140 may detect a location of the sun relative to the hull 102, a wind speed of wind, a water current, a magnetic heading of the hull 102 (e.g., north, south, east, or west), or the like. In some embodiments, the controller 136 may be capable of calculating a location of the sun relative to the hull based on a present date and time of day. The controller 136 may then be capable of calculating an optimal orientation of the hull 102 based on the location of the sun relative to the hull and based on the location of the solar panel 104 on the hull. The optimal orientation of the hull 102 corresponds to an orientation of the hull along the X-Y plane (e.g., a magnetic heading of the hull 102) that results in maximum sunlight reaching the solar panel 104 and, thus, results in maximum power generation by the solar panel 104. The controller 136 may then control the actuator 138 to adjust the rudder 132 to cause the hull 102 to have the optimal orientation in the water. In some embodiments, the controller 136 may also control the thrust generator 128 to achieve the optimal orientation in the water. In some embodiments, the controller 136 may take into account additional variables (e.g., wind direction, wind speed, water current speed and direction, or the like) when controlling the actuator 138 and the thrust generator 128 to achieve the optimal orientation. The additional variables may be input by an operator of the watercraft 100, may be received by a network access device of the watercraft 100 (e.g., a navigation unit that receives such data), may be detected by one or more sensor of the watercraft 100, or the like.

Figure 2A:
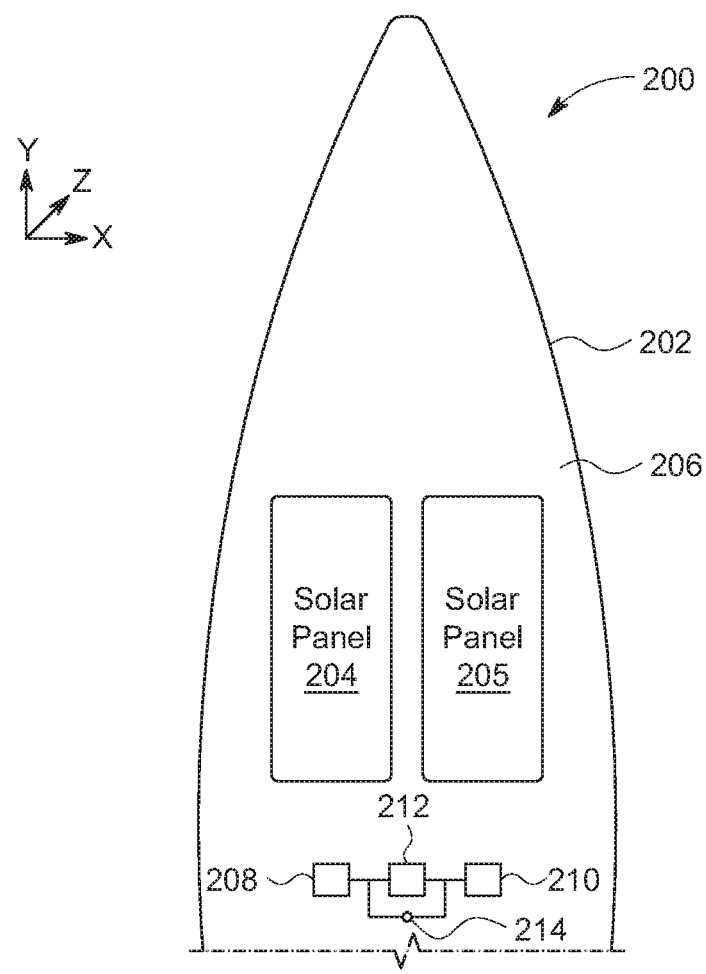
FIG. 2A is a top-down view of a watercraft having at least two solar panels, in accordance with various embodiments of the present disclosure.
Figure 2B:
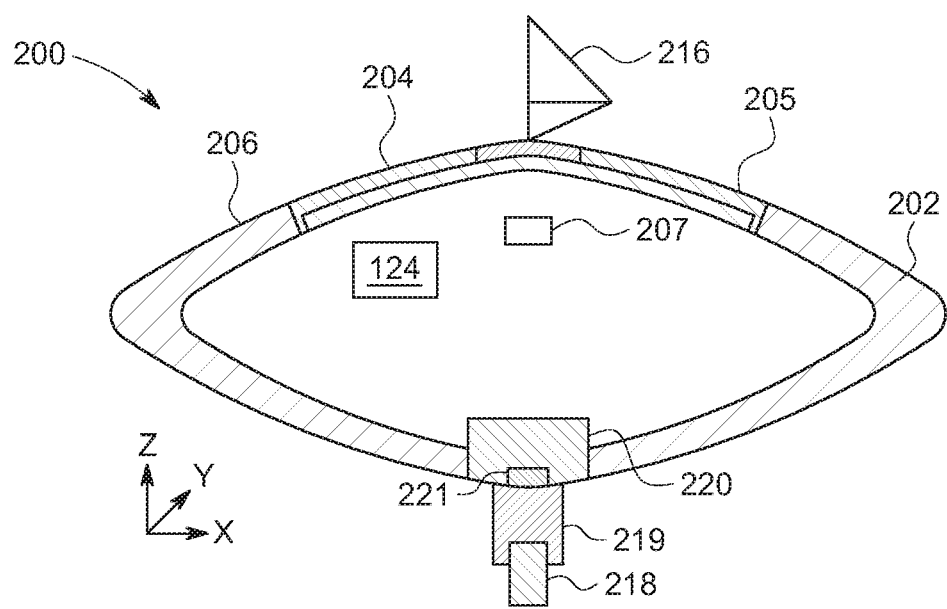
FIG. 2B is a cross-sectional view of the watercraft of FIG. 2A illustrating various features of the watercraft, in accordance with various embodiments of the present disclosure.

Referring now to FIGS. 2A and 2B, another watercraft 200 may include a hull 202 and two solar panels 204, 205. The solar panels 204, 205 may be located on an outer surface 206 of the hull 202. The solar panels 204, 205 may include similar features as the solar panel 104 of FIGS. 1A and 1B such as being installed in a recess defined by the hull 202, encapsulated within a transparent coating, being integral with the hull 202, or the like. However, unlike the watercraft 100 of FIGS. 1A and 1B, the watercraft 200 includes multiple solar panels 204, 205. The watercraft 200 may include any quantity of solar panels dependent upon manufacturer design and specifications. For example, the manufacturer may select a desirable amount of power to be generated by the solar panels 204, 205 and may select a size and quantity of the solar panels 204, 205 to achieve the desirable amount of power.

As with the solar panel 104 of FIGS. 1A and 1B, the solar panels 204, 205 may be located at any location on the outer surface 206 of the hull 202. However, it may be desirable for the solar panels 204, 205 to be installed symmetrically about the longitudinal axis (i.e., symmetrically about the Y axis) in order to evenly distribute weight on both sides of the watercraft 200 and keep the watercraft 200 balanced in the water. Stated differently, the solar panels 204, 205 may be evenly distributed between a first side and a second side, with the first side and the second side being evenly divided about a longitudinal axis of the hull 202 (e.g., parallel to the Y axis). In addition to evenly distributing weight, placement of the solar panels 204, 205 on both sides of the longitudinal axis may increase exposure of at least one solar panel 204, 205 to sunlight regardless of the orientation of the watercraft 200 relative to the sun, and may further evenly distribute weight along the hull 202. However, as referenced above, the solar panels 204, 205 may be located at any location on the outer surface 206 of the hull 202, even if such weight is unevenly distributed. The uneven distribution of weight may be corrected by offsetting the weight differential via additional features such as battery placement.

The watercraft 200 may further include pedals 208, 210. The pedals 208, 210 may be actuated by a user of the watercraft 200 in order to drive a propulsion system (not shown) such as a propeller, hydrofoils, paddles, or the like. The watercraft 200 may further include a switch 214 which may selectively couple the pedals 208, 210 to the propulsion system or to a generator 212. The generator 212 may convert mechanical energy exerted through the pedals 208, 210 into electrical energy for storage in a battery 224. In that regard, a user of the watercraft 200 may use the pedals 208, 210 to propel the watercraft 200 to a desired destination, or may actuate the switch 214 to couple the pedals 208, 210 to the generator 212 and use the pedals 208, 210 to recharge the battery 224 (e.g., in response to determining that the battery 224 has a relatively low SOC). The switch 214 may include any switch such as a manual switch, a hydraulic switch, an electrical switch, or the like. In that regard, the switch 214 may be alternated via a manual control (e.g., a switch) or via electrical control (e.g., an electrical input device, such as a button, may be coupled to the switch 214 and an electrical output of the electrical input device may alternate the switch position based on received user input).

In some embodiments or situations, the watercraft 200 may move through water. For example, the watercraft 200 may include a sail 216 or may otherwise be moved relative to water by wind force (e.g., a sail or due to wind blowing against the hull 202), water current, paddling, pedaling, rowing, or the like. The watercraft 200 may include a turbine 218 as part of a generator 219 that extends into the water. Movement of the hull 202 relative to the water may result in rotation of the turbine 218 (i.e., torque). This rotation of the turbine 218 may cause the generator 219 to generate electrical energy which may be stored in the battery 224 or may be applied directly to an electric component of the watercraft 200. In some embodiments, the turbine 218 may be located in water when in use and the generator 219 may be located in the hull 202 or outside of the hull 202 and outside of the water to reduce drag of the hull 202 through water.

In some embodiments, the hull 202 may define a compartment 220 in which at least one of the turbine 218 or the generator 219 may be stored when not in use (which may reduce drag of the hull 202 through water). In that regard, a user of the watercraft 200 may select when the turbine 218 extends into the water (e.g., when recharging of the battery 224 or additional electrical energy is desired) or when the turbine 218 is stored in the compartment 220 (e.g., when the watercraft 200 is traveling to a destination and reduced friction with water is desired). For example, the user may manually raise the turbine 218 into the compartment 220 and lower the turbine 218 into the water (e.g., using a handle). As another example, the user may provide input to an input device, causing an actuator 221 to raise the turbine 218 into the compartment 220 or lower the turbine 218 into the water in response to receiving an electrical signal. In some embodiments, waterproofing may exist between the turbine 218 and the hull 202 to reduce the likelihood of water flowing into the hull 202 and weighing down the hull 202. For example, a sealed box may surround the turbine 218 when in transit between the raised and lowered position, and the turbine 218 may extend from the sealed box and the box may return to the compartment 220 in response to the turbine 218 being fully lowered.

In some embodiments, a junction box 207 may be in electrical communication with at least one of the solar panels 204, 205 or the turbine 218 and may perform modulation, demodulation, power conversion, or any other function to the electrical energy that is output by the solar panels 204, 205 or the turbine 218 (such as to groom the electrical energy for use by one or more component (e.g., the battery 224) of the watercraft 200).

Figure 3A:
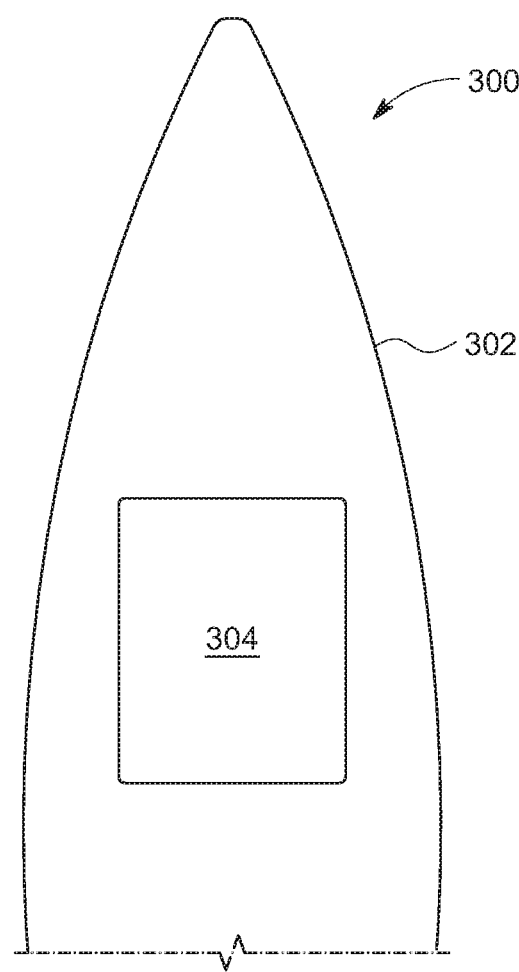
FIG. 3A is a top-down view of a watercraft having a hull with a dome shape formed thereon and a solar panel on the dome, in accordance with various embodiments of the present disclosure.
Figure 3B:
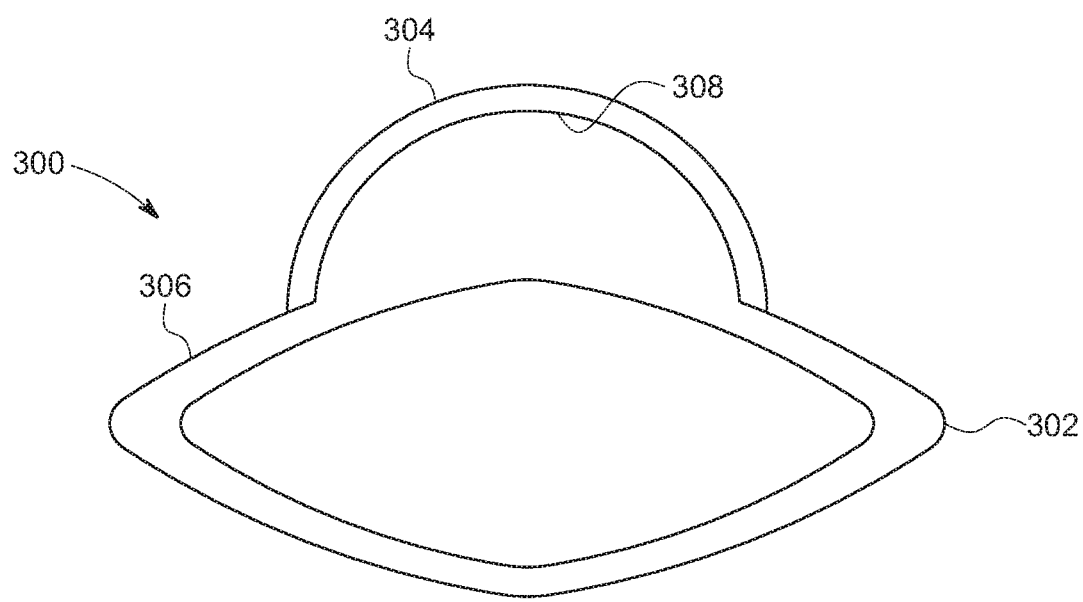
FIG. 3B is a cross-sectional view of the watercraft of FIG. 3A illustrating various features of the watercraft, in accordance with various embodiments of the present disclosure.

Referring now to FIGS. 3A and 3B, another watercraft 300 may include similar features as the watercraft 100 of FIGS. 1A and 1B. In particular, the watercraft 300 may include a hull 302 having an outer surface 306 with a solar panel 304 positioned thereon. The hull 302 may define or include a dome 308 extending outward from the outer surface 306, and the solar panel 304 may be coupled to the dome 308. The dome 308 may have an outer surface, at least a portion of which faces each direction (north, south, east, and west) as well as directions therebetween. The dome 308 may further face multiple angles relative to a horizon. The dome 308 may be curved, multifaceted, or some combination thereof. Because of the shape of the dome 308, at least a portion of the solar panel 304 may face the sun regardless of the location of the sun relative to the hull 302. The dome 308 may be formed integral or monolithic during manufacture of the hull 302, or may be installed on the hull 302 after manufacture of the hull 302 is completed. The solar panel 304 may be curved or multifaceted in order to lay flush with the dome 308 and may have dimensions that match those of the dome 308.

Figure 4A:
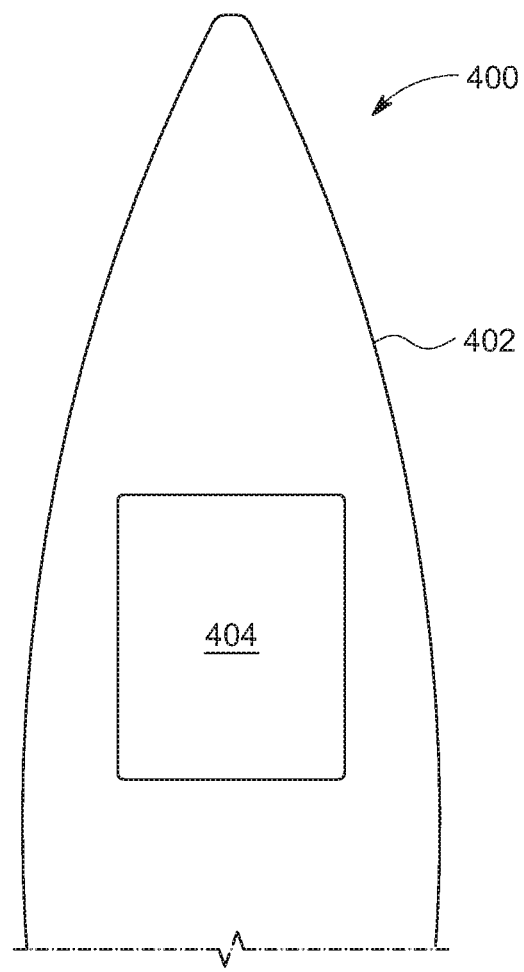
FIG. 4A is a top-down view of a watercraft having a hull with a trench shape formed thereon and a solar panel on the trench, in accordance with various embodiments of the present disclosure.
Figure 4B:
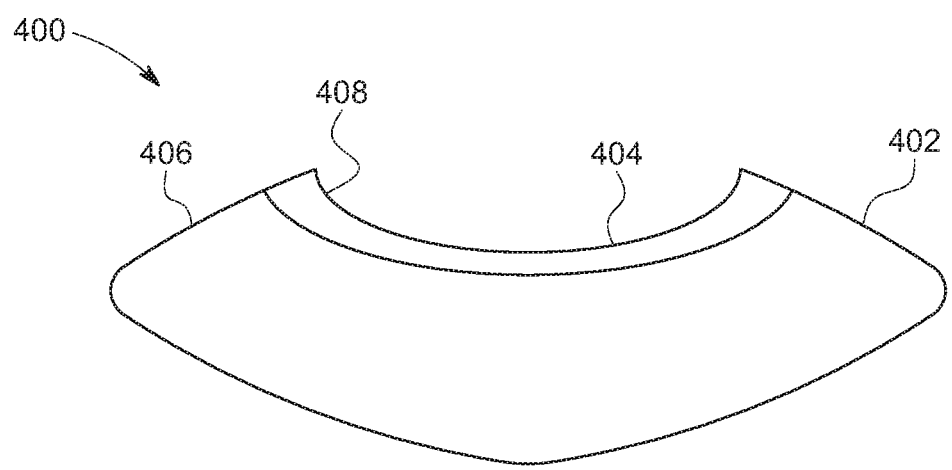
FIG. 4B is a cross-sectional view of the watercraft of FIG. 4A illustrating various features of the watercraft, in accordance with various embodiments of the present disclosure.

Turning to FIGS. 4A and 4B, another watercraft 400 may include similar features as the watercraft 100 of FIGS. 1A and 1B. In particular, the watercraft 400 may include a hull 402 having an outer surface 406 with a solar panel 404 positioned thereon. The hull 402 may define or include a trench or trough 408 (e.g., extending along a portion of a longitudinal axis of the hull 402), and the solar panel 404 may be coupled to the trench 408. The trench 408 may have an outer surface, at least a portion of which faces multiple directions and multiple angles relative to a horizon. The trench 408 may be curved, multifaceted, or some combination thereof. Because of the shape of the trench 408, at least a portion of the solar panel 404 may face the sun regardless of the location of the sun relative to the hull 402.

Figure 5A:
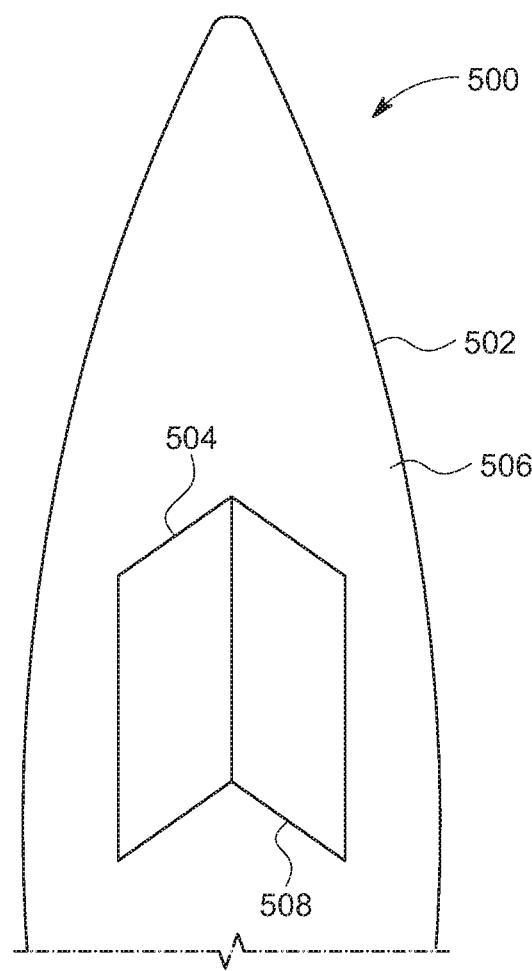
FIG. 5A is a top-down view of a watercraft having a hull with a ridge formed thereon and a solar panel on the ridge, in accordance with various embodiments of the present disclosure.
Figure 5B:
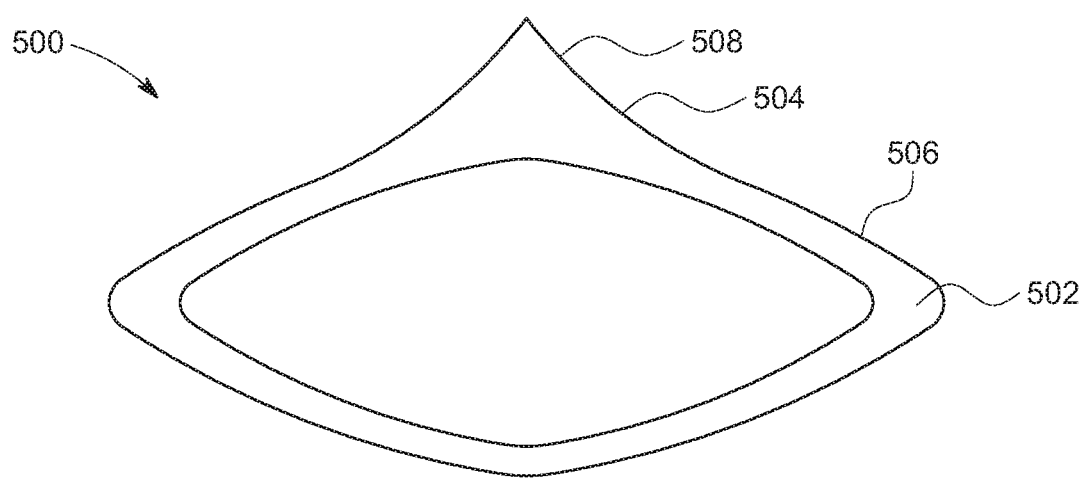
FIG. 5B is a cross-sectional view of the watercraft of FIG. 5A illustrating various features of the watercraft, in accordance with various embodiments of the present disclosure.

Referring now to FIGS. 5A and 5B, another watercraft 500 may include similar features as the watercraft 100 of FIGS. 1A and 1B. In particular, the watercraft 500 may include a hull 502 having an outer surface 506 with a solar panel 504 positioned thereon. The hull 502 may define or include a ridge 508 (e.g., extending along a portion of a longitudinal axis of the hull 502), and the solar panel 504 may be coupled to the ridge 508. The ridge 508 may have an outer surface, at least a portion of which faces multiple directions and multiple angles relative to a horizon. The ridge 508 may be curved, multifaceted, or some combination thereof. Because of the shape of the ridge 508, at least a portion of the solar panel 504 may face the sun regardless of the location of the sun relative to the hull 502.

Figure 6:
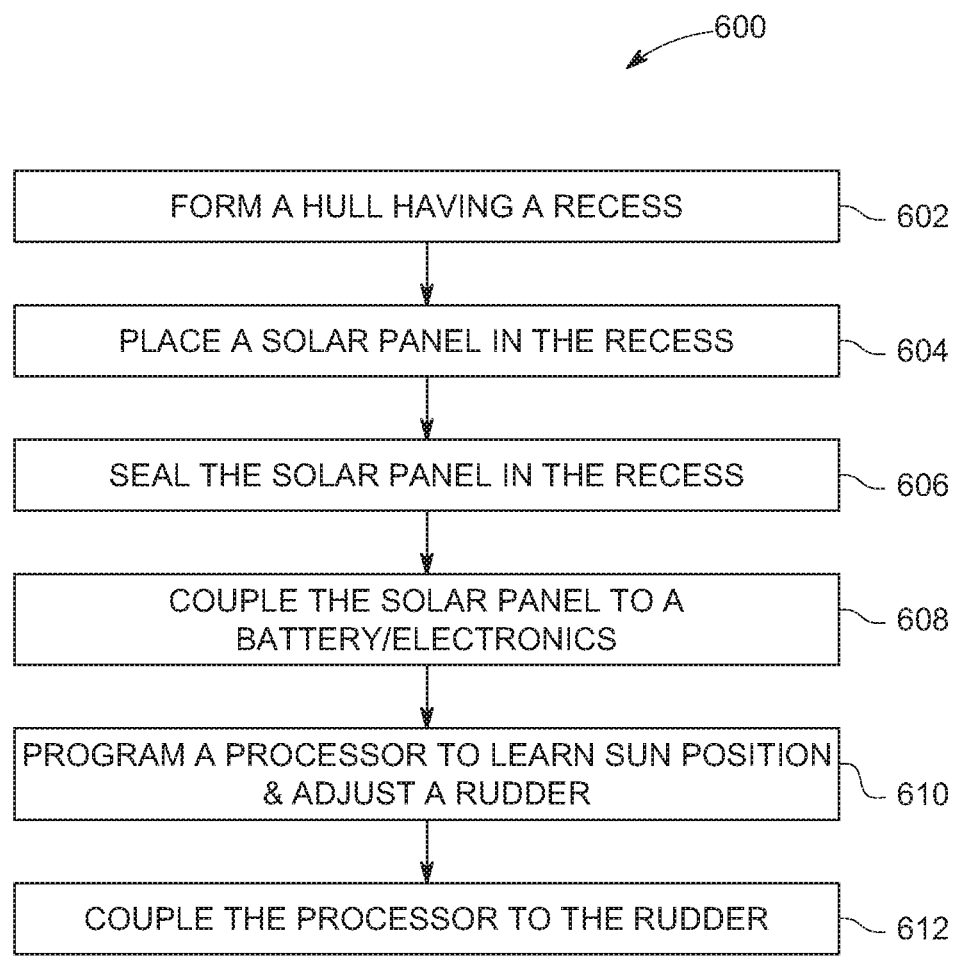
FIG. 6 is a flowchart illustrating a method of forming a watercraft that provides self-sustaining energy generation, in accordance with various embodiments.
Figure 7A:
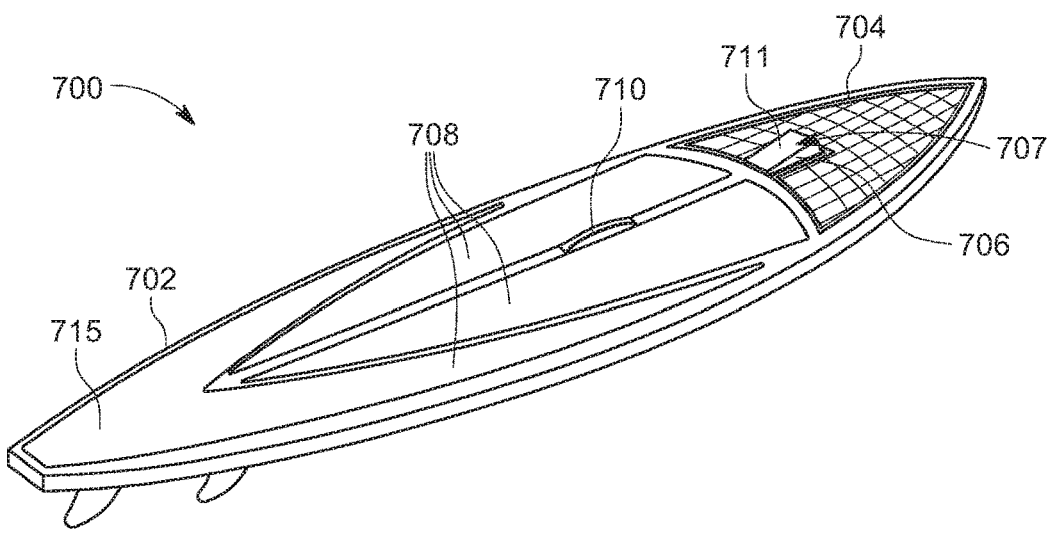
FIG. 7A is a perspective view of a paddleboard having a solar panel, in accordance with various embodiments of the present disclosure.
Figure 7B:
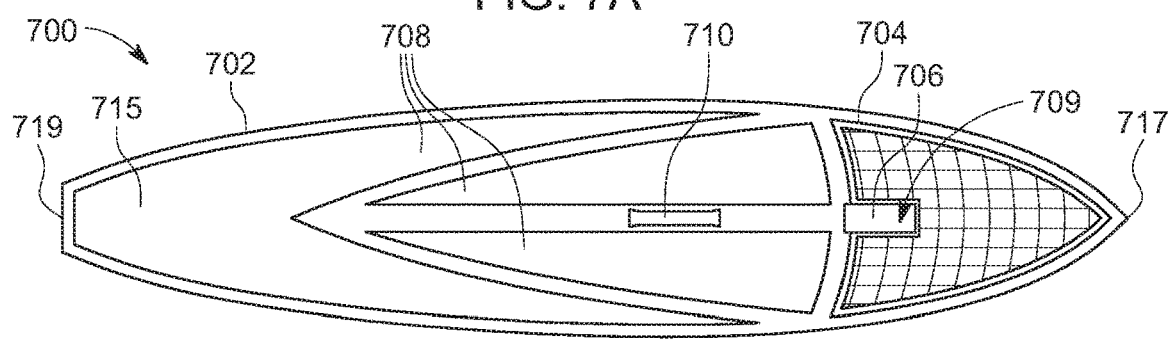
FIG. 7B is a top-down view of the paddleboard of FIG. 6A, in accordance with various embodiments of the present disclosure.
Figure 7C:
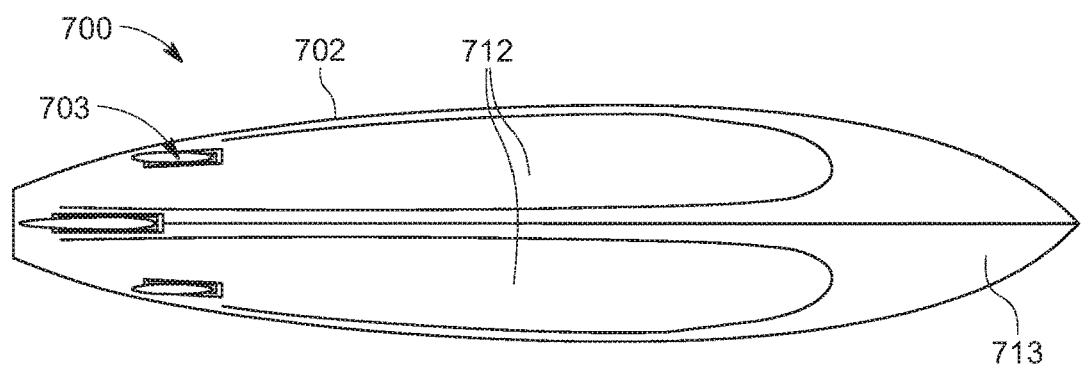
FIG. 7C is a bottom-up view of the paddleboard of FIG. 6A, in accordance with various embodiments of the present disclosure.
Figure 7D:
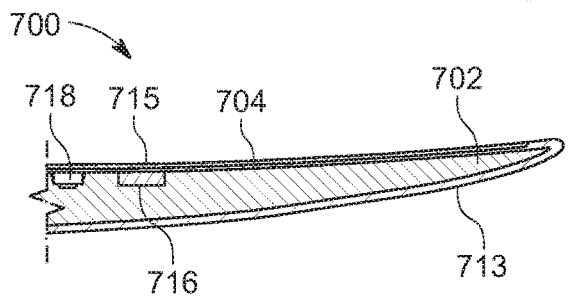
FIG. 7D is a cross-sectional view of the paddleboard of FIG. 6A in a direction perpendicular to a longitudinal axis of the paddleboard, in accordance with various embodiments of the present disclosure.
Figure 7E:
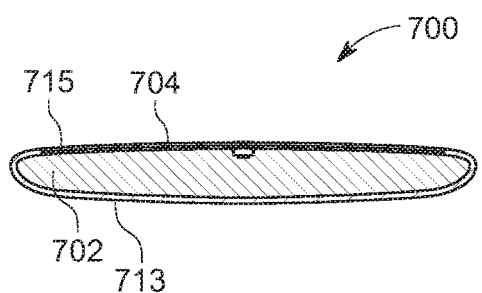
FIG. 7E is a cross-sectional view of the paddleboard of FIG. 6A in a direction parallel to a longitudinal axis of the paddleboard, in accordance with various embodiments of the present disclosure.

FIG. 6 illustrates a method 600 of forming a watercraft (e.g., the watercraft 100 of FIGS. 1A and 1B) that provides self-sustaining energy generation. In block 602, a hull of the watercraft may be formed. The hull may be formed to have a recess in which a solar panel may be placed. The hull may be designed to have any quantity of recesses.

In block 604, a solar panel(s) may be placed in the recess. The solar panel may be coupled to the hull to reduce the likelihood of separation of the solar panel from the hull. The solar panel(s) may be evenly distributed on the port and starboard side of the hull to evenly distribute weight about the hull.

In block 606, the solar panel may be sealed in the recess. For example, a transparent coating may be applied over the solar panel and a portion of the hull to encapsulate the solar panel within the recess. In some embodiments, the coating may be applied about a portion or all of the hull to fully seal the hull.

In block 608, the solar panel may be electrically coupled to a battery or one or more electronic device (e.g., a GPS or navigation system). In some embodiments, other components, such as switches, may be installed between the solar panel and the battery or electronics.

In block 610, a processor or controller may be programmed to learn how to determine a location of the sun relative to the hull based on various received or detected data, and how to control a rudder or propulsion device to adjust the orientation of the hull in the water. In response to being so programmed, the processor may be capable of controlling the rudder or propulsion device to maximize exposure of the solar panel to the sun.

In block 612, the processor may be electronically coupled to the rudder or the propulsion system.

The method 600 may include additional blocks not shown herein to couple, attach, or affix any additional features (e.g., a turbine, a generator, pedals, or the like) to the hull, and to electronically or mechanically couple any of the additional features to other features of the watercraft.

Referring now to FIGS. 7A-7E, another watercraft 700 is shown. The watercraft 700 may be or may resemble a paddleboard. In that regard, the watercraft 700 may include a hull 702 on which a user may sit or stand. The hull 702 may have a top surface 715 and a bottom surface 713, and may include one or more solar panel 704 located on the top surface 715. The solar panel 704 may be formed integral or monolithic with the hull 702. The solar panel 704 may convert sunlight or other light into electrical energy at any time in which the solar panel 704 is exposed to the light. In some embodiments, the solar panel 704 may be located at or proximal to a front end 717 of the hull 702, or may be located at or proximal to a rear end 719 of the hull 702. A user of the watercraft 700 may rarely stand near the front end 717 or the rear end 719 and, thus, is unlikely to accidentally step on and damage the solar panel 704 at these locations. However, the solar panel 704 may be located at any location along the top surface 715 of the hull 702.

The hull 702 may include one or more fin 703 extending away from the bottom surface 713 of the hull 702. For example, the hull 702 may include three fins 703 designed to stabilize the hull 702 in water.

The watercraft 700 may further include one or more pad 708 located on the top surface 715. The one or more pad 708 may provide a friction surface having a relatively great amount of grip. That is, one or more pad 708 may include a relatively rough surface that provides traction and/or friction between the hull 702 and a user to allow the user to more easily stand on the pad 708 relative to standing on a slick surface.

In some embodiments, the watercraft 700 may include a carrying strap 710. The carrying strap 710 may include any strap, handle, or the like that is coupled to the hull 702 and facilitates grouping by a human hand. In that regard, a user may grip the carrying strap 710 in order to lift and carry the watercraft 700. In some embodiments, the carrying strap 710 may be located on the top surface 715 in order to reduce drag that may exist in response to the strap on the bottom surface 713. The carrying strap 710 may include any one or more material such as rope, nylon, or the like.

In some embodiments, the watercraft 700 may include one or more concavity 712 on the bottom surface 713 and on the top surface 715. The one or more concavity 712 may reduce a total mass of the watercraft 700, allowing the watercraft 700 to be more easily carried or maneuvered. In some embodiments, the concavity 712 may include two concavities extending towards the top surface 715 from the bottom surface 713.

In some embodiments, the watercraft 700 may include a battery 716. The battery 716 may be coupled to the solar panel 704 and may store electrical energy generated by the solar panel 704. In some embodiments, the watercraft 700 may include a junction box or regulator 718 coupled to the solar panel 704 and the battery 716. The regulator 718 may perform any function of the junction boxes described above such as regulating a voltage provided to or from the battery 716, preventing overcharging of the battery 716 from the solar panel 704, or the like. The regulator 718 may perform any additional functionality described above with reference to a controller.

The solar panel 704 may further include a charging box 706. In some embodiments, the charging box 706 may be located on, or accessible via, the top surface 715. The charging box 706 may define a waterproof volume 707 in which an electronic device may be positioned. The charging box 706 may include a waterproof cover 711 which may at least partially define the waterproof volume 707. In that regard, the cover 711 may resist water entry into the volume 707. In some embodiments, a gasket or other seal may be located between the cover 711 and the hall 702 in order to resist water flowing into the volume 707. The charging box 706 may have dimensions capable of allowing an electronic device, such as a mobile telephone or a tablet, to be stored therein.

In that regard, the charging box 706 may further include a charger 709. The charger 709 may provide electricity to an electronic device located in the charging box 706. For example, the charger 709 may provide electricity from one or both of the solar panel 704 or the battery 716. For example, the charger 709 may include a lightning cable or port, a USB cable or port, a QI wireless charging pad, or the like. The charger 709 may be electrically coupled to the solar panel 704 and may receive electricity generated by the solar panel 704. In that regard, a user may place an electronic device in the charging box 706, may connect the electronic device to the charger 709, and may use the watercraft on a body of water while the electronic device is safely charging in the charging box 706.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. Throughout the present disclosure, like references numbers may denote like elements. Accordingly, elements with element numbering may be shown in the figures, but may not necessarily be repeated herein for the sake of clarity. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112 (f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for providing solar power to a watercraft, the system comprising:

a hull having an outer surface, defining a recess extending inward and offset from the outer surface by a distance, and configured to float on water;

a solar panel configured to fit within the recess and having a thickness that is substantially equal to the distance such that an outer edge of the solar panel is substantially aligned with the outer surface of the hull; and a transparent coating on an outer surface of the solar panel to resist damage to the solar panel and to facilitate transmission of sunlight through the transparent coating, the coating being further applied around at least a portion of the hull to seal the hull and the solar panel together.

2. The system of claim 1 wherein the recess includes a first recess and a second recess located on an opposite side of the hull from the first recess, and the solar panel includes a first solar panel configured to fit within the first recess and a second solar panel configured to fit within the second recess.

3. The system of claim 1 wherein the transparent coating is waterproof to resist water damage to the solar panel.

4. The system of claim 1 wherein the hull has a curvature, and the solar panel is a flexible solar panel configured to bend along at least a portion of the curvature of the hull.

5. The system of claim 1 further comprising:
an energy storage device positioned in the hull and configured to store electrical energy; and
at least one wire coupled to the solar panel and to the energy storage device and configured to transmit electrical energy generated by the solar panel to the energy storage device for storage.

6. The system of claim 1 wherein the hull has a front, a back, a first side, and a second side, and the solar panel includes at least two solar panels divided evenly between the first side and the second side to balance the hull on the water.

7. The system of claim 1 wherein the hull defines at least one of a dome, a ridge, or a trench, and the solar panel is configured to be coupled to and lay flush with the at least one of the dome, the ridge, or the trench to increase exposure of at least a portion of the solar panel to sunlight regardless of an orientation of the sunlight relative to the hull.

8. The system of claim 1 further comprising a turbine configured to be located in the water in response to the hull floating on the water and to power a generator in response to the hull moving through the water in order to harvest hydropower from the hull moving through the water.

9. The system of 1 further comprising pedals configured to be actuated to propel the hull through the water, and a generator coupled to the pedals and configured to generate power in response to actuation of the pedals.

10. The system of claim 9 further comprising a switch having a first position configured to cause the pedals to propel the hull through the water, and a second position configured to couple the pedals to the generator to cause the pedals to energize the generator.

11. The system of claim 1 further comprising a rudder coupled to the hull and configured to be moved to adjust an orientation of the hull relative to the sunlight to align the solar panel with the sunlight to optimize conversion of the sunlight into electrical energy.

12. The system of claim 11 further comprising a handle configured to adjust the orientation of the hull.

13. The system of claim 12 further comprising a guide configured to convey information regarding how to use the handle to optimize the orientation of the hull relative to the sunlight.

14. The system of claim 11 further comprising an actuator coupled to the rudder and configured to move the rudder, and a controller coupled to the actuator, configured to determine the orientation of the hull relative to the sunlight, and configured to control the rudder via the actuator to adjust the orientation of the hull relative to the sunlight based on the determined orientation of the hull relative to the sunlight.

15. A system for providing solar power to a watercraft, the system comprising:
a hull having an outer surface, defining a recess extending inward and being offset from the outer surface by a distance, the hull being configured to float on water;
a solar panel sealed within the recess and having a thickness that is substantially equal to the distance such that an outer edge of the solar panel is substantially aligned with the outer surface of the hull in response to being sealed with the respective recess; pedals configured to be actuated to propel the hull through the water;
a generator coupled to the pedals and configured to generate power in response to actuation of the pedals; and
a switch having a first position configured to cause the pedals to propel the hull through the water, and a second position configured to couple the pedals to the generator to cause the pedals to energize the generator.

16. The system of claim 15 further comprising:
an energy storage device positioned in the hull and configured to store electrical energy; and
at least one wire coupled to the solar panel and to the energy storage device and configured to transmit electrical energy generated by the solar panel to the energy storage device for storage.

17. A system for providing solar power to a watercraft, the system comprising:
a hull having an outer surface and configured to float on water; and
a solar panel coupled to the hull and configured to generate power in response to receiving sunlight;
pedals coupled to the hull and configured to be actuated to propel the hull through the water;
a generator coupled to the pedals and configured to generate power in response to actuation of the pedals; and
a switch having a first position configured to cause the pedals to propel the hull through the water, and a second position configured to couple the pedals to the generator to cause the pedals to energize the generator.

18. The system of claim 17 further comprising an energy storage device coupled to the solar panel and the generator and configured to store the power generated by the solar panel and the power generated by the generator.

\* \* \* \* \*